(12) United States Patent
Yeric et al.

(10) Patent No.: US 7,745,275 B2
(45) Date of Patent: Jun. 29, 2010

(54) INTEGRATED CIRCUIT AND A METHOD OF MAKING AN INTEGRATED CIRCUIT TO PROVIDE A GATE CONTACT OVER A DIFFUSION REGION

(75) Inventors: Gregory Munson Yeric, Austin, TX (US); Marlin Wayne Frederick, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/232,107

(22) Filed: Sep. 10, 2008

(65) Prior Publication Data

US 2010/0059825 A1 Mar. 11, 2010

(51) Int. Cl.
H01L 21/336 (2006.01)
H01L 29/76 (2006.01)

(52) U.S. Cl. .................. 438/197; 438/637; 438/672; 257/368; 257/385

(58) Field of Classification Search .................. 438/197, 438/618, 620, 637, 638, 640, 672; 257/38–385
See application file for complete search history.

(56) References Cited

U.S. PATENT DOCUMENTS

| | | | | |
|---|---|---|---|---|
| 5,804,846 A | * | 9/1998 | Fuller | 257/252 |
| 6,072,221 A | * | 6/2000 | Hieda | 257/382 |
| 6,869,850 B1 | * | 3/2005 | Blosse et al. | 438/299 |
| 6,946,376 B2 | * | 9/2005 | Chediak et al. | 438/586 |
| 7,547,594 B2 | * | 6/2009 | Yang | 438/197 |
| 2003/0003640 A1 | * | 1/2003 | Lee | 438/199 |
| 2004/0245581 A1 | * | 12/2004 | Tsuchiaki | 257/382 |
| 2005/0236694 A1 | * | 10/2005 | Wu et al. | 257/632 |

* cited by examiner

*Primary Examiner*—Kevin M Picardat
(74) *Attorney, Agent, or Firm*—Nixon & Vanderhye P.C.

(57) ABSTRACT

A method of forming an integrated circuit 68 provides over a diffusion region 28 on a substrate 26 a gate electrode 36. A source electrode is provided by a source local interconnect conductor 30 and a drain electrode is provided by a drain local interconnect conductor 32. An insulator layer 38 is formed over these electrodes and respective electrode openings are formed through the insulator layer 38 so as to provide electrical connection to a Metal1 layer 46, 48, 50. The etching process for the electrode openings is controlled such that the maximum etching depth is insufficient to penetrate through the insulating layer 38 and accordingly short circuit a gate insulator layer 34 provided between the diffusion region 28 and the gate electrode 36. Thus, the gate opening may be positioned over the diffusion region 28. Double patterning followed by separate etching steps for the gate opening and the source/drain opening may be used to control the gate opening depth and permit the gate contact to be position overlying the diffusion region.

50 Claims, 6 Drawing Sheets

INTEGRATED CIRCUIT AND A METHOD OF MAKING AN INTEGRATED CIRCUIT TO PROVIDE A GATE CONTACT OVER A DIFFUSION REGION

BACKGROUND OF THE INVENTION

1. Field of the Invention

This invention relates to the field of integrated circuits. More particularly, this invention relates to a method of making integrated circuits and integrated circuits utilising local interconnect conductors.

2. Description of the Prior Art

It is known to make and provide integrated circuits formed from processes involving multiple stages of lithography, deposition, etching, implantation etc. Advances in these processes have permitted device geometries to reduce thereby increasing the circuit density achievable and reducing cost. Recent production geometries have used devices with feature sizes of 45 nm. Projected future devices are expected to have sizes of 32 nm followed by 22 nm. As these device geometries become smaller, it is becoming increasingly difficult to form the patterns on the integrated circuit during manufacture necessary to create the desired circuit elements. In particular, if it is desired to produce lithographic shapes (patterns) including non-rectilinear shapes, then the accuracy and reliability with which such shapes can be produced is a significant difficulty in producing such integrated circuits. Rectilinear shapes are easier to reliably form. However, it is difficult to make the required connections and circuits using only rectilinear shapes when producing a circuit cell library for forming integrated circuits.

Figure 1:
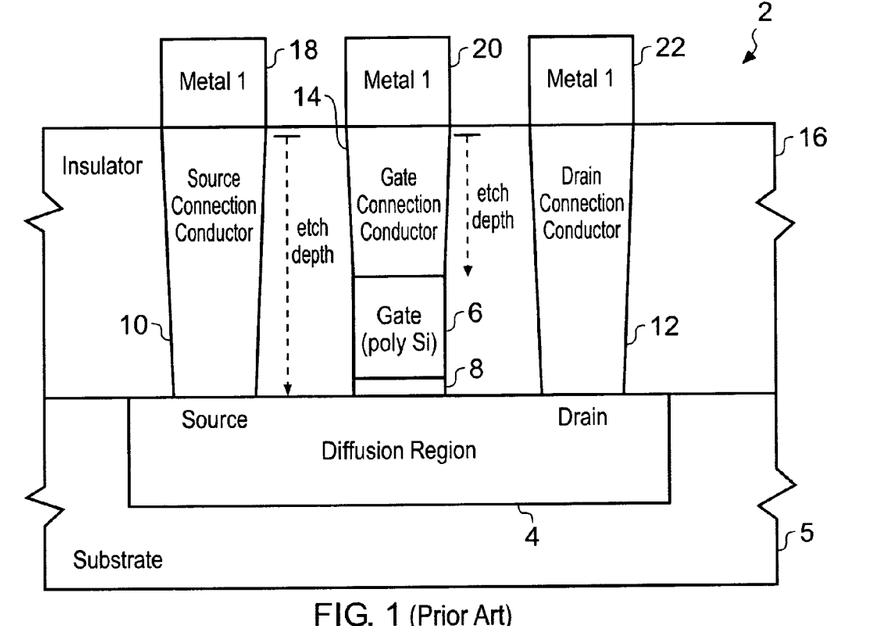
FIG. 1 schematically illustrates a prior art transistor in a side projection view.
Figure 2:
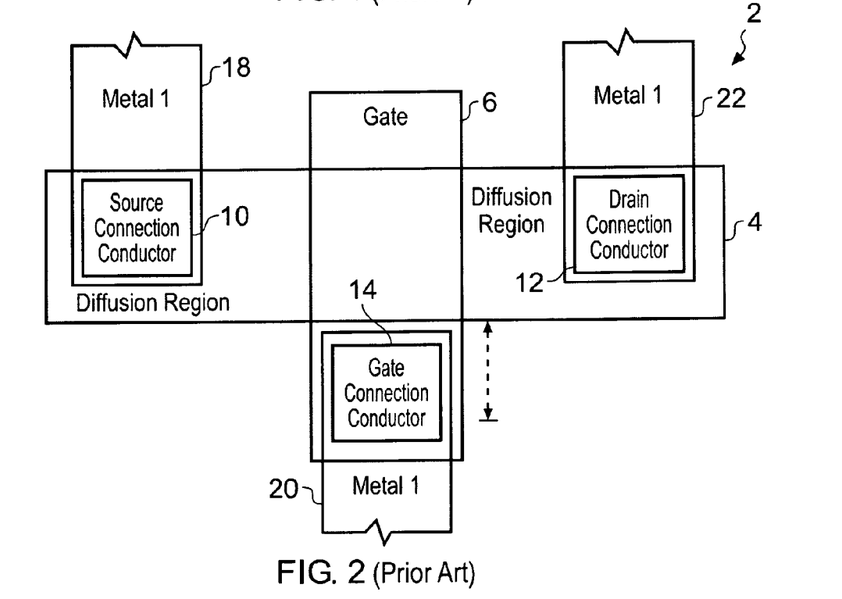
FIG. 2 schematically illustrates the prior art transistor of FIG. 1 in a plan view.

Another factor limiting the density with which circuit elements may be formed upon an integrated circuit is illustrated with reference to FIGS. 1 and 2 of the accompanying drawings. FIG. 1 illustrates a transistor 2 formed using a diffusion region 4 within a substrate 5 over which are formed a gate electrode 6 (a polysilicon channel) separated by a gate insulator layer 8 from the diffusion region 4. A source connection conductor 10 and a drain connection conductor 12 serve to provide a source electrode and a drain electrode contacting the diffusion region 4. The gate electrode 6 is provided with a gate connection conductor 14. The source connection conductor 10, the drain connection conductor 12 and the gate connection conductor 14 all extend through an insulator layer 16 toward Metal1 layer connections 18, 20, 22.

When manufacturing the transistor 2 illustrated in FIG. 1 it would be normal to form the diffusion region 4 in the substrate 6 and then deposit the gate insulator layer 8 and the gate electrode 6 over the diffusion region 4. The insulator layer 16 would then be formed covering the gate electrode 16 and the diffusion region 4 before a source opening, a drain opening and a gate opening were etched through the insulating layer 16 to respectively reach the diffusion region 4 to provide the source access, the diffusion region 4 to provide the drain access and the upper surface of the gate electrode 6 to provide gate access. The source opening, the drain opening and the gate opening are then filled with connection conductor material, such as tungsten, in a deposition step. Subsequently the Metal1 connections 18, 20, 22 are formed over the source connection conductor 10, the drain connection conductor 12 and the gate connection conductor 14 so as to provide electrical connections to other portions of the integrated circuit concerned.

As illustrated in FIG. 1, the etch depth required in order to etch the source opening and the drain opening is significantly greater than the etch depth required to etch the gate opening.

The etching process used to etch through the insulating layer 16 will remove material of the insulator layer, but will not remove the gate electrode 6 to any significant degree. Accordingly, providing the alignment of the gate opening is accurately over the gate electrode 6, then the etching of the gate opening will stop when it reaches the upper surface of the gate electrode 6. The etching of the source opening and the drain opening will continue until the surface of the diffusion region 4 is reached. However, if the alignment of the etching of the gate opening is not sufficiently accurate, it is possible that the gate opening may continue down the side of the gate electrode 6 and reach the diffusion region 4. In this case, when the gate connection conductor 14 is then deposited in the gate opening, it will create a short circuit past the gate insulator layer rendering the transistor 2 non operative. It will be appreciated that in a modern integrated circuit containing many millions of transistors, if only a few of these transistors are incorrectly formed, then the entire integrated circuit may not function properly. Accordingly, the alignment of the gate opening over the gate electrode 6 is a source of failure which is conventionally addressed by the arrangement illustrated in FIG. 2. FIG. 2 illustrates a plan view of the transistor 2 shown in FIG. 1. As is illustrated in FIG. 2, the gate opening and the subsequently formed gate connection conductor 14 are offset so that they do not overlie the diffusion region 4. Thus, any misalignment in the etching of the gate opening may cause an excessively deep gate opening to be formed, but this gate opening will not reach the diffusion region 4 and accordingly cannot cause a short circuit past the gate insulating layer 8. Thus, a common design rule when forming circuit cells for integrated circuits is that the gate opening where the gate connection will be formed must not overlie the diffusion region 4. Whilst this approach avoids the short circuit problem discussed above, it reduces the density achievable for circuit elements within the final integrated circuit.

SUMMARY OF THE INVENTION

Viewed from one aspect the present invention provides a method of making an integrated circuit, said method comprising the steps of:

forming on a diffusion region of a semiconductor substrate a gate electrode spaced by a gate insulator layer from said diffusion region and at least one local interconnect conductor, each local interconnect conductor respectively forming one of a source electrode and a drain electrode;

depositing an upper insulator layer over said diffusion region, said gate electrode and said at least one local interconnect conductor;

etching through said upper insulator layer at least one electrode opening reaching an upper surface of one of said local interconnect conductors and a gate opening overlying said diffusion region and reaching at least an upper surface of said gate electrode, etching of said gate opening being such that said gate opening has a maximum depth insufficient to reach said diffusion region; and depositing an electrode connection conductor in to each of said at least one electrode opening and a gate connection conductor in to said gate opening.

The present technique recognises that the use of a local interconnect conductor to form one or both of the source and drain electrodes on a gate separately from forming the electrode connection conductors has a number of significant advantages. A first advantage is that this arrangement permits a much greater use of pure rectilinear forms within the circuits. These rectilinear forms are easier to accurately and reliably manufacture at small geometry sizes. Furthermore, the electrode openings that need to be etched through the insulator layer to reach the upper surface of the local interconnect conductors are shallower and comparable in depth to the depth of the gate opening. This permits various techniques to be used in the etching of the gate opening and the electrode openings such that the gate opening has a maximum etch depth insufficient to reach the diffusion region of the transistor. In this way the potential short circuit of the gate insulator layer may be avoided and the constraint of not placing the gate connection over the diffusion layer may be removed. This permits significantly higher circuit densities to be achieved.

It will be appreciated that a circuit element being formed containing a gate electrode may contain a variable number of other electrodes to which it is desired to make an electrical connection through the insulator layer. In the case of a standalone transistor, both a source electrode and a drain electrode may be required to be provided with connections through the insulator layer and accordingly respective openings will be provided through that insulating layer. In other circuit arrangements, such as double-stack transistors (e.g. two input NAND gates or two input OR gates) an individual transistor within these elements may only require one electrode to have a connection through the insulator layer in addition to the connection provided to the gate electrode through the insulator layer. It will be appreciated that for some devices and fabrication technologies further contacts, such as a substrate contact, may be required. The present techniques encompass such other devices and fabrication technologies.

The gate electrode may be disposed on the diffusion region between the source local interconnect conductor and the drain local interconnect conductors. These local interconnect conductors may be used to impart a strain in the structure (e.g. due to compressive or tensile stress created in the local interconnect conductor regions etc) in a manner which improves the speed of the devices concerned (e.g. increasing electron mobility). This approach works well when the gate electrode is disposed on the diffusion region between a source local interconnect conductor and a drain local interconnect conductor.

Whilst not necessarily required, some embodiments will provide the one or more electrode openings so as to overlie the diffusion region as this will also tend to permit higher circuit density to be achieved.

The at least one local interconnect conductor and the gate electrode may be formed as substantially parallel rectilinear bodies so as to ease manufacture.

The at least one local interconnect conductor can have an aspect ratio such that its length is at least three times larger than its width measure in a plane substantially parallel to the substrate.

It will be appreciated that the gate electrode could be formed of a variety of materials. The use of polysilicon for the gate electrode is convenient in many embodiments. In other processes materials such as titanium nitride may be used to form the gate electrode.

In a similar way, the local interconnect conductors can be formed of a variety of different materials and tungsten is a convenient material to use. In some embodiments materials such as titanium nitride or tantalum may be used to line the openings in the insulating layer so as to provide a diffusion barrier.

It will be appreciated that the insulating layer may be comprised of a plurality of heterogeneous material layers. For example, the insulating layer may contain a silicon dioxide layer plus a nitrogen rich stress liner layer, or additionally a low-k polymer layer.

The etching of the openings for the gate electrode and one or both of the source and drain electrodes can be controlled in a variety of different ways. In a first technique the local interconnect conductors and the gate electrode may be formed on the substrate and then a lower insulator layer formed on top. This lower insulator layer may then be covered with an etch stop layer which is formed (e.g. subject to further processing steps) such that it covers the lower insulator layer surrounding where the gate opening is to be etched and does not cover the upper surface of the gate electrode to which an electrical connection is to be made. This could be achieved in a variety of different ways. Etching of the gate opening may then be performed with parameters such that the etching will etch through the insulating layer but will not etch through the etch stop layer which is surrounding the gate electrode (but not covering its upper surface).

The etch stop layer may extend to cover the upper surface of the local interconnect conductors and the etching of the electrode openings can be performed with parameters such that it will etch through these etch stop layers so as to permit an electrical contact to be made to the local interconnect conductor through the electrode opening. This etching of the electrode openings will accordingly be performed in a separate step the etching of the gate openings.

Photoresists may be used to protect some of the openings during etching steps not targeted at those openings if desired.

In another embodiment separate etching steps for etching the gate openings and the electrode openings may be used with the parameters (e.g. duration, intensity, . . . ) of the etching used in respect of the gate opening being such that the maximum etch depth achievable will be insufficient to reach the diffusion layer even if there was misalignment. The gate opening may be covered by a resist layer during etching of the source and/or drain electrode openings. This approach can use double-patterning techniques.

In another embodiment it may be possible to etch the electrode openings and the gate openings at the same time whilst maintaining a maximum possible etch depth below that at which a short circuit of the gate electrode could arise providing the depths of the openings needed are all sufficiently close together.

In another technique the substrate and the gate electrode at an early processing stage may be covered with an etch stop layer and then the etch stop layer may be removed from the upper surface of the gate electrode. This prevents etching of the gate opening from reaching the diffusion region.

A first metal connection layer can be deposited over the at least one electrode connection conductor and the gate connection conductor so as to connect the transistor to other portions of the integrated circuit. This first metal connection layer may be formed as a dual damascene layer with the at least one electrode connection conductor and the gate connection conductor as a single process. Such dual damascene layers help relax alignment constraints and reduce the number of process steps.

The first metal layer may be formed of rectilinear conductors based substantially perpendicular to the major axis of the local interconnect conductors and gate electrodes. This is useful in increasing the density of sites where connections may be made from the first metal layer into underlying regions.

Whilst it will be appreciated that the present technique produces circuit components which are capable of a high packing density when considered individually, increased advantages may be achieved when circuit elements of this form are used throughout an integrated circuit in its entirety, or in a majority of circuit cells, by forming components having all pure rectilinear shapes. It may be that an integrated circuit could contain a relatively small number of non-rectilinear shapes, but the present technique does permit a majority of rectilinear shapes to be used through an integrated circuit. Even if the packing density were not significantly increased, the use of mainly rectilinear shaped eases manufacture thereby increasing yield and reducing cost.

It will be appreciated that the local interconnect conductor as well as being used to form an electrode on the diffusion layer may also extend to provide a connection to other adjacent or nearby circuit element(s) without requiring a connection via the metal one layer through an opening in the insulator layer. This further increases the availability of connection sites, the achievable density and the ease of manufacture.

Viewed from another aspect the present invention provides an integrated circuit comprising:

a diffusion region formed on a semiconductor substrate;

at least one local interconnect conductor formed on said diffusion region, each local interconnect conductor respectively forming one of a source electrode and a drain electrode;

a gate electrode formed on said diffusion region, said gate electrode being spaced by a gate insulator layer from said diffusion region;

an insulator layer formed over said diffusion region and having at least one electrode opening reaching at least an upper surface of one of said at least one local interconnect conductor and a gate opening overlying said diffusion region and reaching at least an upper surface of said gate electrode, said gate opening having a maximum depth insufficient to reach said diffusion region;

an electrode connection conductor deposited in each said electrode opening; and a gate connection conductor deposited in said gate opening.

Viewed from another aspect the invention provides a method of making an integrated circuit, said method comprising the steps of:

forming on a diffusion region of a semiconductor substrate a gate electrode spaced by a gate insulator layer from said diffusion region;

depositing an insulator layer over said diffusion region and said gate electrode;

in separate etching steps using separate patterns formed on said insulator layer etching through said insulator layer at least one electrode opening reaching an upper surface of diffusion region for forming an electrode and etching a gate opening overlying said diffusion region and reaching at least an upper surface of said gate electrode, etching of said gate opening being such that said gate opening has a maximum depth insufficient to reach said diffusion region; and depositing an electrode connection conductor in to each of said at least one electrode opening and a gate connection conductor in to said gate opening.

This technique exploits the two stage etchingpatterning that is likely already required to be used for feature size reasons to additionally allow separate control of the etching of the gate openings thereby permitting the gate contact to be positioned over the diffusion region allowing an increase in circuit density.

Viewed from another aspect the invention provides an integrated circuit comprising:

a diffusion region formed on a semiconductor substrate;

a gate electrode formed on said diffusion region, said gate electrode being spaced by a gate insulator layer from said diffusion region;

an insulator layer formed over said diffusion region and having at least one electrode opening reaching at least an upper surface of said diffusion region and a gate opening overlying said diffusion region and reaching at least an upper surface of said gate electrode, said gate opening having a maximum depth insufficient to reach said diffusion region;

an electrode connection conductor deposited in each said electrode opening; and a gate connection conductor deposited in said gate opening.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 3:
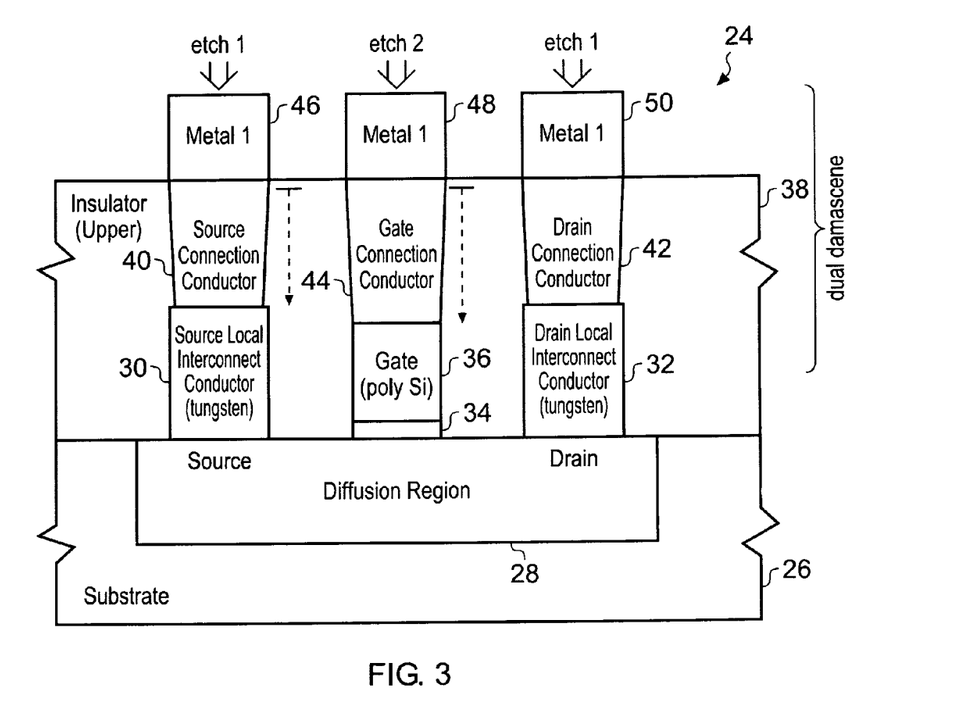
FIG. 3 schematically illustrates a side projection view of a first example transistor using a local interconnect conductor for the source electrode and the drain electrode.
Figure 4:
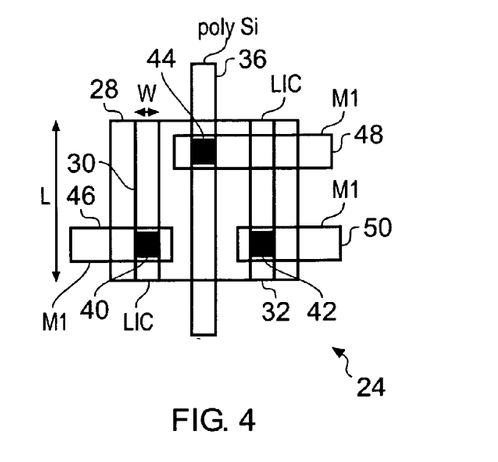
FIGS. 4 and 5 schematically illustrate plan views of transistors using the technique described in relation to FIG. 3.

FIG. 3 is a side projection view of a transistor 24. A substrate 26 is provided with a diffusion region 28. The diffusion region 28 may, for example, be formed by dopant implantation using techniques familiar to those in this technical field. Over the diffusion region 28 there are then formed a source local interconnect conductor 30 and a drain local interconnect conductor 32. Both of these may be formed of tungsten and have a pure rectilinear shape extending out of the plane of FIG. 3. The formation of the source local interconnect conductor 30 and the drain local interconnect conductor 32 may use conventional lithographic techniques. These lithographic techniques are aided by the pure rectilinear form of the source local interconnect conductor 30 and the drain local interconnect conductor 32. These pure rectilinear forms are such that the length L of the source local interconnect conductor 30 and the drain local interconnect conductor 32 is at least three times greater than their width W when measure in a plane substantially parallel to the substrate 26. The length L and width W are illustrated in FIG. 4.

A gate insulator layer 34 is formed on the diffusion region 28 and a gate electrode 36 is formed over the gate insulator layer 34. Again, conventional photolithographic techniques may be used. The gate electrode 36 may be formed of polysilicon.

It will be appreciated that there are a variety of different techniques which may be used to form the source local interconnect conductor 30, the drain local interconnect conductor 32, the gate insulator layer 34 and the gate electrode 36. These techniques include the position, etching, photo lithography, chemical-mechanical planarization and other techniques. The order in which these electrodes are formed may vary.

An insulator layer 38 is formed over the substrate 26, the diffusion region 28, the source local interconnect conductor 30, the drain local interconnect conductor 32, the gate insulator layer 34 and the gate electrode 36. This insulator layer 38 (which can be considered the upper layer in this example) has a thickness greater than the height of the underlying structures forming the electrodes. A source opening to be filled by a source connection conductor 40, a drain opening to be filled by a drain connection conductor 42 and a gate opening to be filled by a gate connection conductor 44 are then formed by one or more etching steps.

In one technique the source opening, the drain opening and the gate opening may all be formed simultaneously in one etching step with the etching parameters (e.g. duration, intensity, etchant, . . . etc) of that etching step being chosen such that the maximum etching depth achieved will not be sufficient to penetrate completely through the insulating layer 38 thereby providing a potential short circuit bypassing the gate insulator layer 34 should there be any misalignment of the gate opening over the gate electrode 36 or if the gate opening should be substantially larger than the gate. It will be appreciated that since the source opening, the drain opening and the gate opening all have roughly similar depths due to the presence of the source local interconnect conductor 30 and the drain local interconnect conductor 32, simultaneous etching with a maximum etch rate insufficient to penetrate through the complete insulator layer 38 is possible. The source opening, the drain opening and the gate opening need not have exactly the same depth as the structures they are trying to reach are separately formed, but nevertheless it will be seen in comparison with FIG. 3 and FIG. 3 that it is no longer necessary that the source opening and the drain opening should penetrate completely through the insulator layer 38 in order that an electrical contact may be made to the source and drain of the transistor 24. The source opening, the drain opening and the gate opening can then be filled using a deposition step with the source connection conductor 40, the drain connection conductor 42 and the gate connection conductor 44. A Metal1 connection layer 46, 48, 50 connecting to these connection conductors 40, 42, 44 may then be further deposited. It will be appreciated that it is also possible to form the Metal1 layer and the source connection conductor 40, drain connection conductor 42 and the gate connection conductor 44 as part of the deposition of a dual damascene layer. This reduces processing steps and helps provide good contact with increased resistance to misalignment.

In another variation of the method of forming the transistor shown in FIG. 3, the etching of the source opening and the drain opening may be performed in one etching step and the etching of the gate opening may be formed in a separate etching step. The etching of the source opening and the drain opening does not have the potential for introducing an unwanted short circuit since a direct connection to the diffusion region 28 is in any case desired. Accordingly, it is possible that the source opening and the drain opening could be performed with a relatively aggressive etching process which is rapid and need not be as carefully controlled in a manner seeking to control the maximum etching depth. During such an etching of the source opening and the drain opening separately from the gate opening, the insulator layer 38 corresponding to the area where the gate opening is to be formed may be protected with a resist layer formed using a photo lithographic technique. This resist layer can then be removed and etching of the gate opening performed using a technique where the maximum etch depth would not reach the diffusion region 28. It will be appreciated that the separate etching processes could be performed in a different order and a variety of alternatives will be apparent to those in this technical field. These alternatives are encompassed in the present technique in exploiting the presence of the local interconnect connectors 30, 32 in providing electrodes to the diffusion region 28 extending up to a height above the diffusion region 28 comparable with the height of the gate electrode 36 and permitting a more reliable etching process for the electrode openings to be achieved. These techniques exploit double-patterning in forming the shapes of the openings to be etched in a way that may already be required in view of the difficulties of printing patterns at small geometry sizes.

FIG. 4 schematically illustrates a plan view of one example of a transistor 24 produced in accordance with the technique described above in relation to FIG. 3. It will be noted that the gate connection conductor 44 overlies the diffusion region 28. This permits a higher circuit density to be achieved compared to the arrangement illustrated in FIG. 2. It will also be noted that the transistor 24 is formed of a collection of pure rectilinear components (polysilicon channels, local interconnect conductors, Metal1 layer connections, etc). Such pure rectilinear components are easier to form (print) at small geometry sizes, which are already significantly below the wavelength of the illuminating radiation being used.

Figure 5:
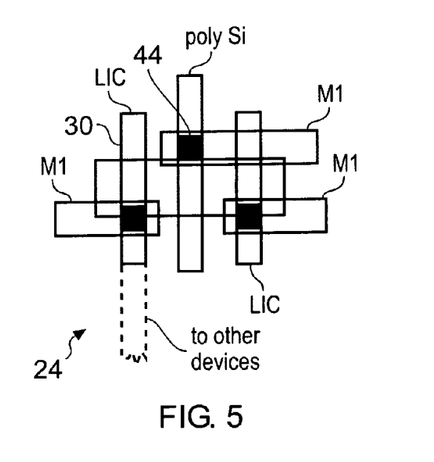

FIG. 5 is a plan view of an alternative transistor 24 produced in accordance with the techniques described in relation to FIG. 3 and having a smaller diffusion region 28. The gate connection conductor 44 still overlies the diffusion region 28 although this time it only partially overlies the diffusion region 28. Nevertheless, an increased circuit density is achievable. The limiting factor in this case may be the minimum spacing between the electrode openings which are formed (minimum pin spacing).

Illustrated in a dotted line in FIG. 5 is an extension to the local interconnect conductor 30 which may be made to connect to other devices within an integrated circuit (e.g. adjacent and/or local/nearby other devices). The use of the local interconnect conductor 30 in this way increases the circuit density achievable.

FIG. 4 and FIG. 5 also show that the source connection conductor 40 and the drain connection conductor 42 also overlie the diffusion region 28. However when the local interconnect conductor 30 is extended beyond the diffusion region as shown by the dotted line in FIG. 5, it then becomes possible to place the source and/or drain conductors 40 and/or 42 anywhere along the local interconnect shape, not necessarily on the diffusion region itself. This further increases the circuit density achievable.

Figure 6:
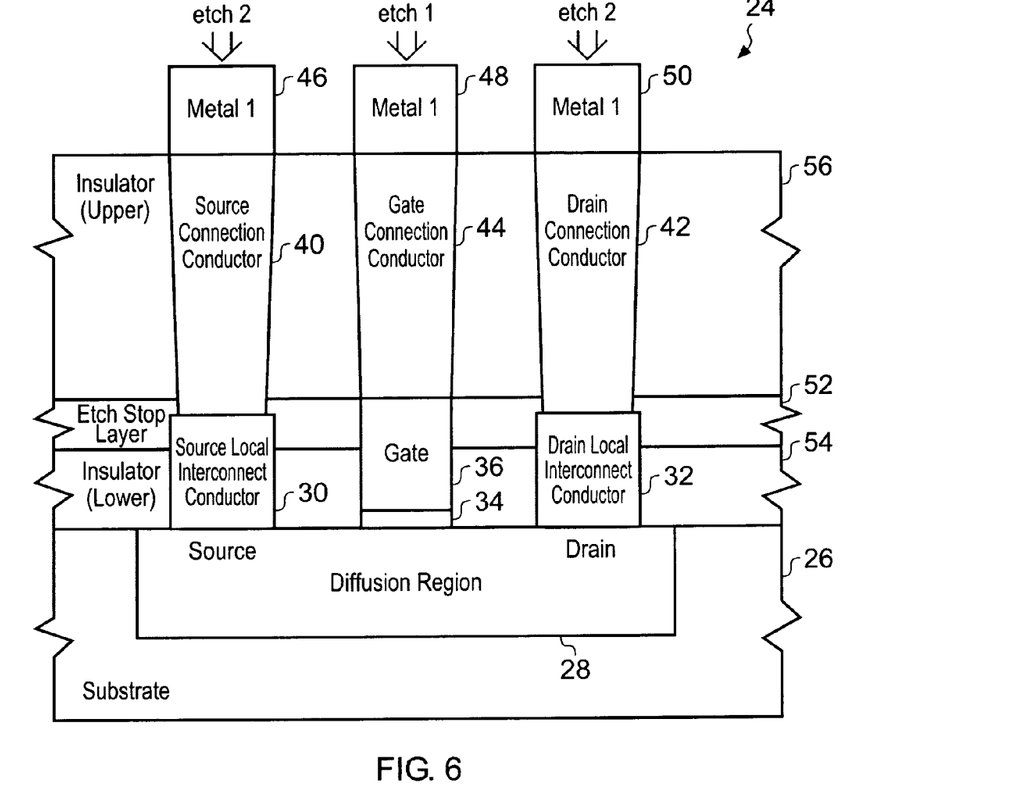
FIG. 6 schematically illustrates a transistor using local interconnect conductors as source and drain electrodes together with an etch stop layer used to control the etching of gate openings and electrode openings.

FIG. 6 illustrates another example transistor formed in accordance with the present techniques. In this example like elements to those illustrated in FIG. 3 have been provided with the same reference numerals. A main difference between the example of FIG. 6 and the example of FIG. 3 is the presence of an etch stop layer 52 formed over a lower insulator layer 54 and beneath an upper insulator layer 56. In practice the lower insulator layer 54 with the source local interconnect conductor 30, the drain local interconnect conductor 32, the gate insulator layer 34 and the gate electrode 36 may all be formed using deposition, etching and other techniques familiar to those in this field. The etch stop layer 52 may then be deposited over the top of the lower insulator layer 54. As shown, the gate electrode 36 is higher than the source local interconnect conductor 30 and the drain local interconnect conductor 32. Accordingly, a mechanical cutting technique such as chemical-mechanical planarization may be used to cut through the etch stop layer 52 until the upper surface of the gate electrode 36 is exposed. The etch stop layer 52 may or may not still cover the upper surfaces of the source local interconnect conductor 30 and the drain local interconnect conductor 32. The geometry of the example shown in FIG. 6 is such that the etch stop layer 52 would continue to cover the source local interconnect conductor 30 and the drain local interconnect conductor 32.

At this point the upper insulator layer 56 may be deposited. A first etch process may then be performed. This first etch process may have parameters selected such that it will not etch through the etch stop layer 52. Accordingly, since the etch stop layer 52 surrounds the gate electrode 36 even if there is misalignment of the gate opening in comparison with the gate electrode 36, the gate opening will not extend past the etch stop layer 52 and accordingly the gate opening will not be too deep and reach down to the diffusion layer 28. The source opening and the drain opening may have their portion lying within the upper insulating layer 56 removed during this etching step. Alternatively, if double-patterning is being used, then the etching of the source opening and the drain opening may in any case be separately performed. When the etching of the gate opening is complete, the gate opening may be protected with a resist and then etching through the etch stop layer 52 to reach the upper surface of the source local interconnect conductor 30 and the drain local interconnect conductor 32 may be performed. This etching through the etch stop layer 52 will be performed with etch processing having different parameters than those used to etch the gate opening since the etching of the gate opening is intentionally not intended to be capable of etching through the etch stop layer 52.

Subsequently the source connection conductor 40, the drain connection conductor 42 and the gate connection conductor 44 may be formed within the source opening, the drain opening and the gate opening. The Metal1 layer 46, 48, 50 may then also be formed. It will be appreciated from the above that there are a variety of different ways in which an etch stop layer 52 may be used in conjunction with the present techniques employing the local interconnect conductors 30, 32 in providing electrodes to the diffusion region 28. These alternative techniques are encompassed herein.

Figure 7:
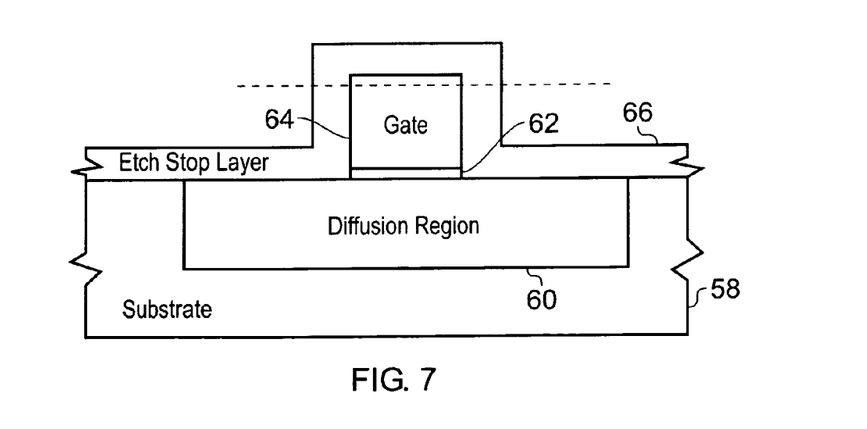
FIG. 7 schematically illustrates the provision of an etch stop layer over a substrate and a gate electrode.

FIG. 7 illustrates how a substrate 58 may be formed with a diffusion region 60, a gate insulator layer 62 and a gate electrode 64 thereupon. An etch stop layer 66 can then be formed over the substrate 58, the diffusion region 60, the gate insulator layer 62 and the gate electrode 64 as shown. The upper surface of the gate electrode 64 can then be exposed using a technique such as depositing an insulator layer and then using chemical-mechanical planarization to cut down through that etch stop layer 66 to the required depth.

Figure 8:
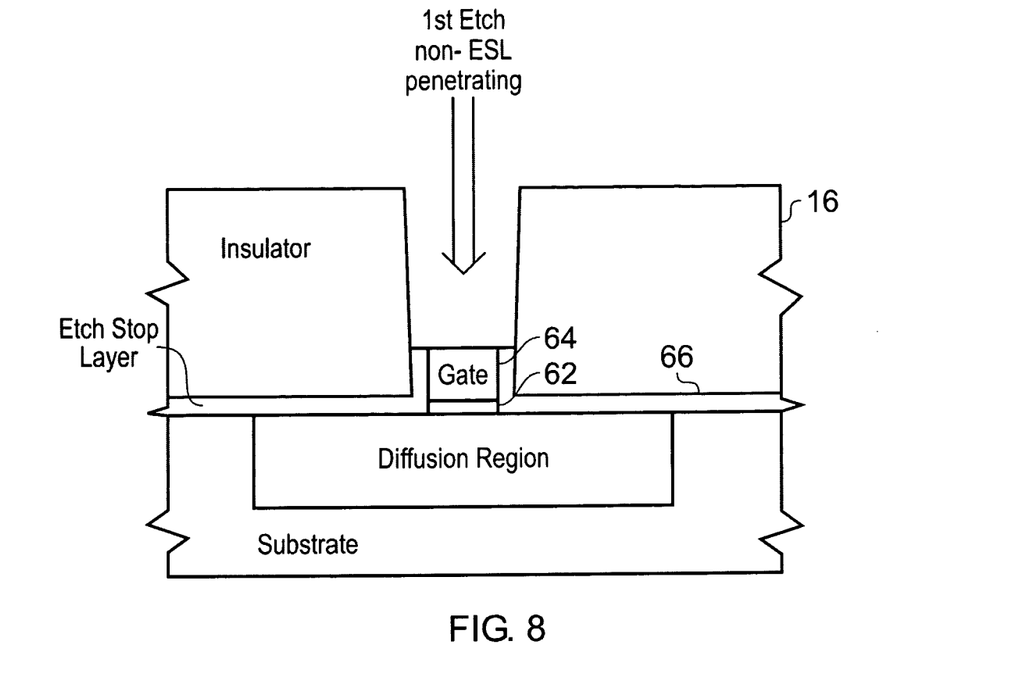
FIGS. 8 and 9 schematically illustrate an example technique for forming electrode openings with an etch stop layer over a substrate and a gate electrode using double patterning.
Figure 9:
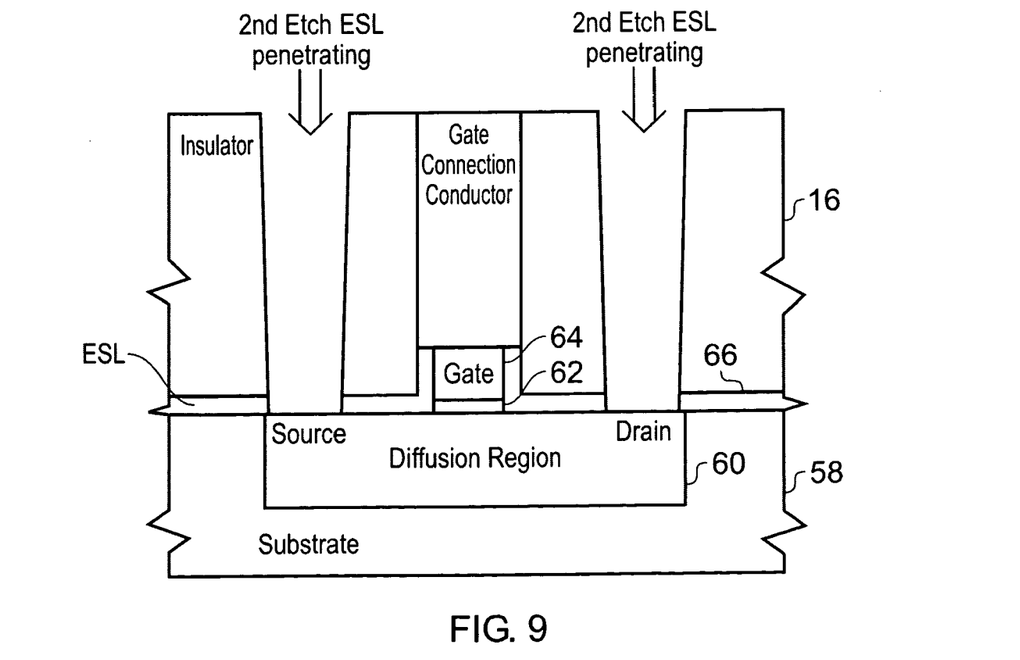

FIGS. 8 and 9 illustrate how the substrate 58, gate insulator layer 62, gate electrode 64 and etch stop layer 66 of FIG. 7 may be used with a two phase etching process (using double patterning) to firstly etch the gate opening with etch parameters insufficient to penetrate the etch stop layer 66, thereby guaranteeing there will be no short circuit of the gate insulator layer 62. This is the etch illustrated in FIG. 8—this first etch is non-ESL penetrating and so the etch stop layer 66 surrounding the gate electrode 64 will prevent the gate opening become too deep. This first etch is performed based upon a first pattern of resist printed as the first phase in a double patterning process.

A separate second etch may then be performed as shown in FIG. 9 which will penetrate the etch stop layer 66 so as to form the source opening and the drain opening. The gate opening can be filled with the gate connection conductor prior to this second etch. A second pattern of resist will also be printed in order to define the regions of the insulator 16 where the source opening and the drain opening are to be etched. The requirement to separately etch the source opening and the drain opening from the gate opening is an additional overhead, but provides the ability to reliably position the gate opening over the diffusion region 60 resulting in increased circuit density. Furthermore, the small geometry size and wavelength of etching light (as well as optical parameters such as numerical aperture of the etching system) may in practice already require the patterning to be performed in two phase with respective different patterns as it is not possible to print the full pattern all together, i.e. the system may already require double patterning. This technique of FIGS. 7, 8 and 9 could be used without the local interconnect conductors, although this would have the disadvantage of making it more difficult to utilise a high proportion of pure or rectilinear shapes in forming the circuit cells. The gate opening, the source opening and the drain opening are all filled with electrode connection conductor material after they are formed to permit any necessary connections to a Metal1 layer.

Figure 10:
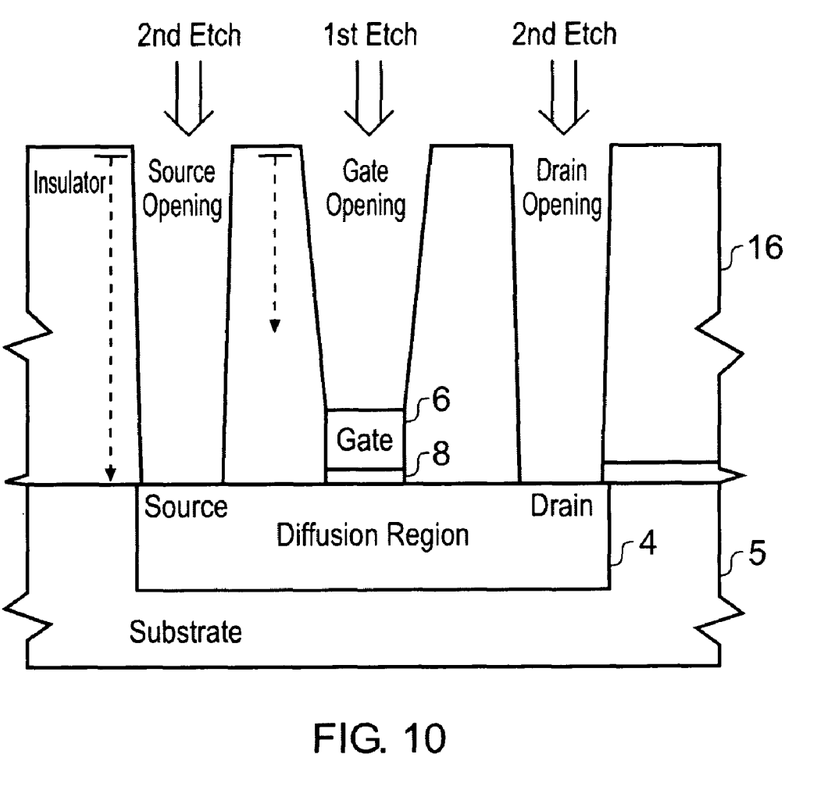
FIG. 10 schematically illustrates an example technique for forming electrode openings using double patterning.

FIG. 10 schematically illustrates another example embodiment. In this embodiment no etch stop layer is provided. Double patterning with separate printing and etching of the patterns defining the gate opening (first etch) and the source opening and drain opening (second etch) is performed. The first etch is perfomed with etching parameters (duration, intensity, etchant, etc) selected such that the maximum etch depth will not be sufficient to reach the diffusion region 4 and cause a short circuit. The gate opening may then be filled with the gate connection conductor or resist (or in some other way protected from etching) while the second etch is performed using a second printed pattern defining the source opening and the drain opening. This second etch may be performed with more aggressive etching parameters sufficient to ensure that the etch depth will properly reach down to the diffusion region 4 in order to permit a source contact and drain contact to be formed.

It will be appreciated that in FIGS. 8, 9 and 10 it has been described that the gate opening is formed before the source opening and the drain opening but that this is only one example and other orderings are possible and encompassed by these techniques exploiting double patterning, with and without an etch stop layer.

Figure 11:
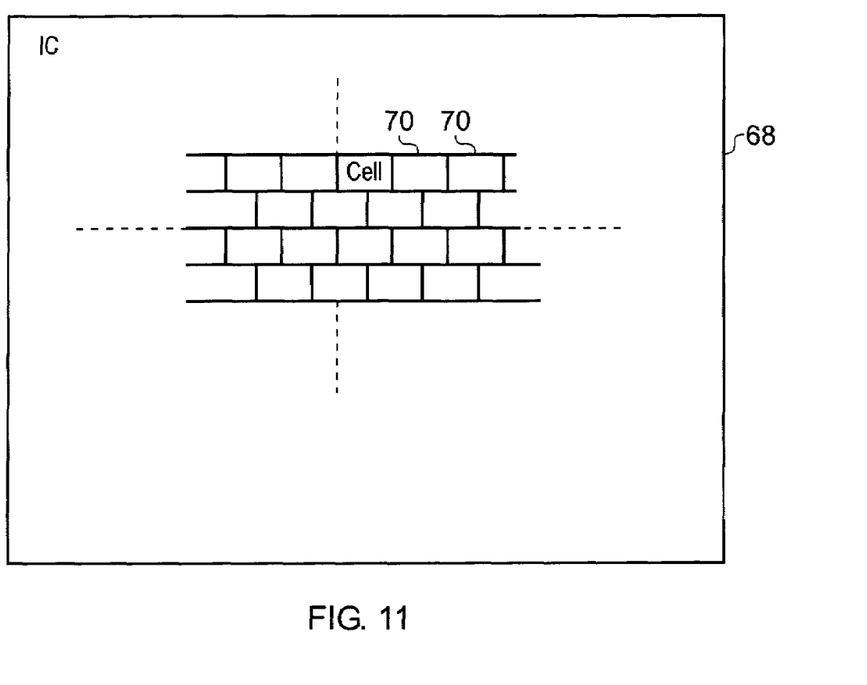
FIG. 11 schematically illustrates an integrated circuit composed of multiple circuit cells.

FIG. 11 schematically illustrates an integrated circuit 68 formed of a plurality of circuit cells 70. This type of technique will be familiar to those in the relevant technical field of designing and laying out integrated circuits. The circuit cells 70 typically contain many devices, such as the transistors previously discussed. Improved ease of manufacture may be achieved when a majority or all of the circuit cells utilise pure rectilinear structures in their form.

Figure 12:
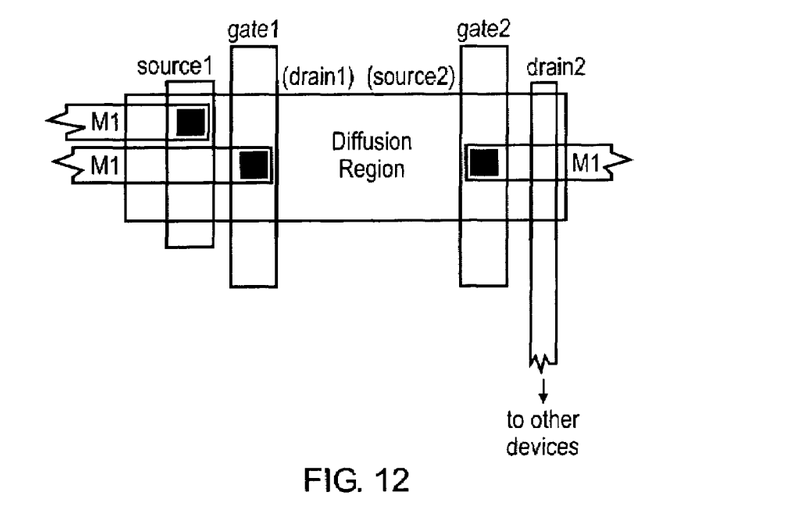
FIG. 12 schematically illustrates a plan view of a circuit element that may be considered as two transistors with two gates, each transistor having only a single further electrode being provided with connection through the insulating layer to the metal one layer.

FIG. 12 schematically illustrates an example of a stack device formed of two transistors each having a respective gate. One transistor is provided with a source electrode utilising the local interconnect conductor techniques described previously. This source electrode has an associated source connection conductor attaching to the Metal1 layer. The other transistor is provided with a drain electrode formed using a drain local interconnect conductor. In this case the drain local interconnect conductor connects to other devices and does not require a connection to the Metal1 layer. Nevertheless, in the device illustrated in FIG. 12, the use of the present technique permits the gate openings required for the Metal1 connections to the gate electrodes to be provided over the diffusion region in a manner which increases circuit density.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A method of making an integrated circuit, said method comprising the steps of:
    forming on a diffusion region of a semiconductor substrate a gate electrode spaced by a gate insulator layer from said diffusion region and at least one local interconnect conductor, each local interconnect conductor respectively forming one of a source electrode and a drain electrode and said at least one local interconnect conductor extending above the diffusion region a distance comparable to a distance said gate electrode extends above the diffusion region;
    depositing an upper insulator layer over said diffusion region, said gate electrode and said at least one local interconnect conductor;
    etching through said upper insulator layer (a) at least one electrode opening, said opening reaching an upper surface of said at least one local interconnect conductor and (b) a gate opening overlying said diffusion region and reaching at least an upper surface of said gate electrode, etching of said gate opening being such that said gate opening has a maximum depth insufficient to reach said diffusion region; and
    depositing an electrode connection conductor in each of said openings.

2. A method as claimed in claim 1, wherein said at least one local interconnect conductor comprises a drain local interconnect conductor and a source local interconnect conductor, a drain opening reaching to an upper surface of said drain local interconnect conductor and a source opening reaching to an upper surface of said source local interconnect conductor.

3. A method as claimed in claim 2, wherein said gate electrode is disposed on said diffusion region between said source local interconnect conductor and said drain local interconnect conductor.

4. A method as claimed in claim 1, wherein said one or more electrode openings overlie said diffusion region.

5. A method as claimed in claim 1, wherein said at least one local interconnect conductor and said gate electrode are substantially parallel rectilinear bodies.

6. A method as claimed in claim 5, wherein said at least one local interconnect conductor has a length L and a width W, both measured in a plane substantially parallel to said substrate, L being at least three times larger than W.

7. A method as claimed in claim 1, wherein said gate electrode is formed of polysilicon.

8. A method as claimed in claim 1, wherein said at least one local interconnect conductor is formed of tungsten.

9. A method as claimed in claim 1, wherein said at least one local interconnect conductor and said gate electrode are formed in respective openings in a lower insulator layer.

10. A method as claimed in claim 9, comprising the step of forming an etch stop layer so as at least to cover said lower insulator layer surrounding where said gate opening is to be etched and not to cover said upper surface of said gate electrode and wherein etching of said gate opening does not etch through said etch stop layer.

11. A method as claimed in claim 10, wherein said etch stop layer is formed to cover said upper surface of said at least one local interconnect conductor and etching of said electrode opening does etch through said etch stop layer and is performed in a separate step to etching said gate opening.

12. A method as claimed in claim 1, wherein said etching of said at least one electrode source opening is performed in a separate etching step to etching of said gate opening and etching of said gate opening is performed with etching parameters selected to etch to a depth insufficient to reach said diffusion layer.

13. A method as claimed in claim 12, wherein said gate opening is covered by a resist layer during etching of said at least one electrode opening.

14. A method as claimed in claim 1, wherein said etching of said at least one electrode opening and said gate opening are performed in a common etching step with etching parameters selected to etch to a depth insufficient to reach said diffusion layer.

15. A method as claimed in claim 1, comprising the steps of forming an etch stop layer so as at least to cover said substrate surrounding said gate electrode and said gate electrode and removing said etch stop layer from said upper surface of said gate electrode and wherein etching of said gate opening does not etch through said etch stop layer.

16. A method as claimed in claim 1, comprising a step of depositing a first metal connection layer over said at least one electrode connection conductor and said gate connection conductor so as to connect a transistor comprising said diffusion layer, said gate electrode and said at least one local interconnect conductor to other portions of said integrated circuit.

17. A method as claimed in claim 16, wherein said first metal connection layer is a dual damascene layer formed with said at least one electrode connection conductor and said gate connection conductor.

18. A method as claimed in claim 16, wherein said first metal layer is formed of rectilinear conductors disposed substantially perpendicular to a major axis of said at least one local interconnect conductor and said gate electrode.

19. A method as claimed in claim 1, wherein said integrated circuit is formed of a plurality of circuit cells and a majority of said plurality of circuit cells are formed by depositing components having all pure rectilinear shapes.

20. A method as claimed in claim 1, wherein at least one of said at least one local interconnect conductor connects a transistor comprising said diffusion layer, said gate electrode and said at least one local interconnect conductor to other portions of said integrated circuit.

21. An integrated circuit comprising:
    a diffusion region formed on a semiconductor substrate;
    at least one local interconnect conductor formed on said diffusion region, each local interconnect conductor respectively forming one of a source electrode and a drain electrode;
    a gate electrode formed on said diffusion region, said gate electrode being spaced by a gate insulator layer from said diffusion region, said at least one local interconnect conductor extending above the diffusion region a distance comparable to a distance said gate electrode extends above the diffusion region;

an insulator layer formed over said diffusion region and having at least one electrode opening reaching at least an upper surface of said at least one local interconnect conductor and a gate opening overlying said diffusion region and reaching at least an upper surface of said gate electrode, said gate opening having a maximum depth insufficient to reach said diffusion region;

an electrode connection conductor deposited in said at least one electrode opening; and a gate connection conductor deposited in said gate opening.

22. An integrated circuit as claimed in claim 21, wherein said at least one local interconnect conductor comprises a drain local interconnect conductor and a source local interconnect conductor, a drain opening reaching to an upper surface of said drain local interconnect conductor and a source opening reaching to an upper surface of said source local interconnect conductor.

23. An integrated circuit as claimed in claim 22, wherein said gate electrode is disposed on said diffusion region between said source local interconnect conductor and said drain local interconnect conductor.

24. An integrated circuit as claimed in claim 21, wherein said one or more electrode openings overlie said diffusion region.

25. An integrated circuit as claimed in claim 21, wherein said at least one local interconnect conductor and said gate electrode are substantially parallel rectilinear bodies.

26. An integrated circuit as claimed in claim 25, wherein said at least one local interconnect conductor has a length L and a width W, both measured in a plane substantially parallel to said substrate, L being at least three times larger than W.

27. An integrated circuit as claimed in claim 21, wherein said gate electrode is formed of polysilicon.

28. An integrated circuit as claimed in claim 21, wherein said at least one local interconnect conductor is formed of tungsten.

29. An integrated circuit as claimed in claim 21, wherein said at least one local interconnect conductor and said gate electrode are formed in respective openings in a lower insulator layer.

30. An integrated circuit as claimed in claim 29, comprising an etch stop layer at least covering said lower insulator layer surrounding said gate opening and not covering said upper surface of said gate electrode.

31. An integrated circuit as claimed in claim 21, comprising an etch stop layer covering said substrate surrounding said gate electrode and side walls of said gate electrode and not covering said upper surface of said gate electrode.

32. An integrated circuit as claimed in claim 21, comprising a first metal connection layer deposited over said at least one electrode connection conductor and said gate connection conductor so as to connect a transistor comprising said diffusion layer, said gate electrode and said at least one local interconnect conductor to other portions of said integrated circuit.

33. An integrated circuit as claimed in claim 32, wherein said first metal connection layer is a dual damascene layer formed with said at least one electrode connection conductor and said gate connection conductor.

34. An integrated circuit as claimed in claim 32, wherein said first metal layer comprises rectilinear conductors disposed substantially perpendicular to a major axis of said at least one local interconnect conductor and said gate electrode.

35. An integrated circuit as claimed in claim 21, wherein said integrated circuit is formed of a plurality of circuit cells and a majority of said plurality of circuit cells are formed by depositing components having all pure rectilinear shapes.

36. An integrated circuit as claimed in claim 21, wherein at least one of said at least one local interconnect conductors connects a transistor comprising said diffusion layer, said gate electrode and said at least one local interconnect conductor to other portions of said integrated circuit.

37. A method of making an integrated circuit, said method comprising the steps of:

forming on a diffusion region of a semiconductor substrate a gate electrode spaced by a gate insulator layer from said diffusion region;

depositing an insulator layer over said diffusion region and said gate electrode;

in separate etching steps using separate patterns formed on said insulator layer etching through said insulator layer at least one electrode opening reaching an upper surface of diffusion region for forming an electrode and etching a gate opening overlying said diffusion region and reaching at least an upper surface of said gate electrode, etching of said gate opening being such that said gate opening has a maximum depth insufficient to reach said diffusion region; and depositing an electrode connection conductor in said at least one electrode opening and a gate connection conductor in said gate opening.

38. A method as claimed in claim 37, wherein said at least electrode opening comprises a source opening and a drain opening for forming a source electrode and a drain electrode.

39. A method as claimed in claim 37, wherein said one or more electrode openings overlie said diffusion region.

40. A method as claimed in claim 38, wherein said source electrode, said drain electrode and said gate electrode are substantially parallel rectilinear bodies.

41. A method as claimed in claim 37, wherein said electrode has a length L and a width W, both measured in a plane substantially parallel to said substrate, L being at least three times larger than W.

42. A method as claimed in claim 37, wherein said gate electrode is formed of polysilicon.

43. A method as claimed in claim 37, wherein said at least one electrode is formed of tungsten.

44. A method as claimed in claim 37, wherein said gate opening is covered by a resist layer during etching of said at least one electrode opening.

45. A method as claimed in claim 37, comprising the steps of forming an etch stop layer so as at least to cover said substrate surrounding said gate electrode and said gate electrode and removing said etch stop layer from said upper surface of said gate electrode and wherein etching of said gate opening does not etch through said etch stop layer.

46. A method as claimed in claim 37, comprising a step of depositing a first metal connection layer over said at least one electrode connection conductor and said gate connection conductor so as to connect a transistor comprising said diffusion layer, said gate electrode and said at least one electrode to other portions of said integrated circuit.

47. A method as claimed in claim 46, wherein said first metal connection layer is a dual damascene layer formed with said at least one electrode connection conductor and said gate connection conductor.

48. A method as claimed in claim 46, wherein said first metal layer is formed of rectilinear conductors disposed substantially perpendicular to a major axis of said gate electrode.

49. A method as claimed in claim 37, wherein said integrated circuit is formed of a plurality of circuit cells and a majority of said plurality of circuit cells are formed by depositing components having all pure rectilinear shapes.

50. An integrated circuit comprising:
a diffusion region formed on a semiconductor substrate;
a gate electrode formed on said diffusion region, said gate electrode being spaced by a gate insulator layer from said diffusion region;
an insulator layer formed over said diffusion region and having at least one electrode opening reaching at least an upper surface of said diffusion region and a gate opening overlying said diffusion region and reaching at least an upper surface of said gate electrode, said gate opening having a maximum depth insufficient to reach said diffusion region;
an electrode connection conductor deposited in said at least one electrode opening; and
a gate connection conductor deposited in said gate opening.

* * * * *